US008101974B2

(12) United States Patent
Ohno et al.

(10) Patent No.: US 8,101,974 B2
(45) Date of Patent: Jan. 24, 2012

(54) SEMICONDUCTOR DEVICE AND MANUFACTURING METHOD THEREOF

(75) Inventors: Hiroshi Ohno, Kawasaki (JP); Takaharu Itani, Yokohama (JP); Eiji Morifuji, Yokohama (JP); Norikazu Ooishi, Saitama (JP); Toshihiko Iinuma, Yokohama (JP); Yoshinori Honguh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 12/328,551

(22) Filed: Dec. 4, 2008

(65) Prior Publication Data

US 2009/0146310 A1    Jun. 11, 2009

(30) Foreign Application Priority Data

Dec. 5, 2007    (JP) .................. 2007-315056

(51) Int. Cl.
*H01L 27/10*    (2006.01)
*H01L 29/76*    (2006.01)
*H01L 29/94*    (2006.01)
*H01L 23/48*    (2006.01)
*H01L 23/52*    (2006.01)

(52) U.S. Cl. ......... 257/202; 257/773; 257/368; 257/786

(58) Field of Classification Search .................. 257/202, 257/207, 368, 393, 392, 903, 529, 758, 773, 257/786, 208, 734
See application file for complete search history.

(56) References Cited

U.S. PATENT DOCUMENTS 6,596,604 B1    7/2003    Lojek et al. ................... 438/401
6,660,462 B1 *    12/2003    Fukuda ......................... 430/394

FOREIGN PATENT DOCUMENTS

JP    2000-138177    5/2000

OTHER PUBLICATIONS

Ito, et al., "*10-15 nm Ultrashallow Junction Formation by Flash-Lamp Annealing*", Jpn. J. Appl. Phys., vol. 41, pp. 2394-2398, Part 1, No. 4B, Apr. 2002.

* cited by examiner

*Primary Examiner* — Chuong A. Luu
(74) *Attorney, Agent, or Firm* — Ohlandt, Greeley, Ruggiero & Perle, L.L.P.

(57) ABSTRACT

A semiconductor device subjected to an optical annealing process by radiation light whose principal wavelength is 1.5 µm or less includes a circuit pattern region formed on a semiconductor substrate, and a dummy pattern region formed separately from the circuit pattern region on the semiconductor substrate. The circuit pattern region has an integrated circuit pattern containing a gate pattern related to a circuit operation. The dummy pattern region has dummy gate patterns that have the same structure as that of a gate pattern used in the integrated circuit pattern and the dummy gate patterns are repeatedly arranged with a pitch 0.4 times or less the principal wavelength.

20 Claims, 13 Drawing Sheets

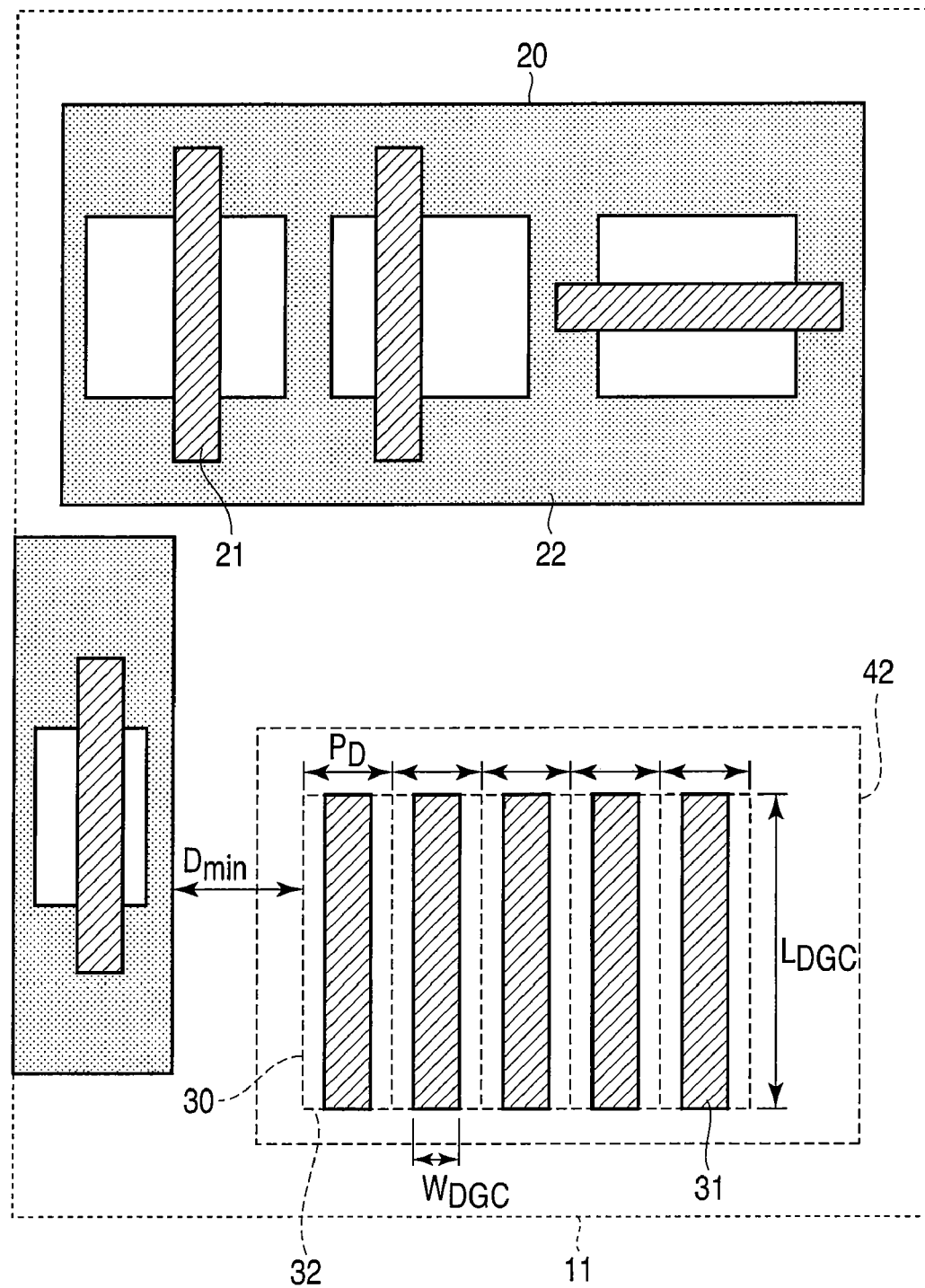
F I G. 3

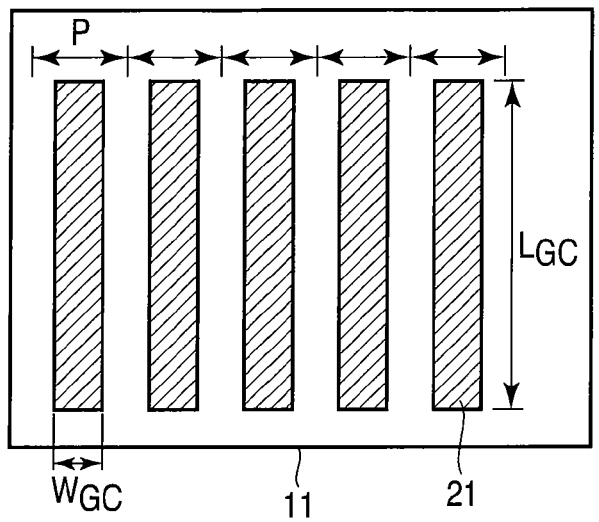
F I G. 4
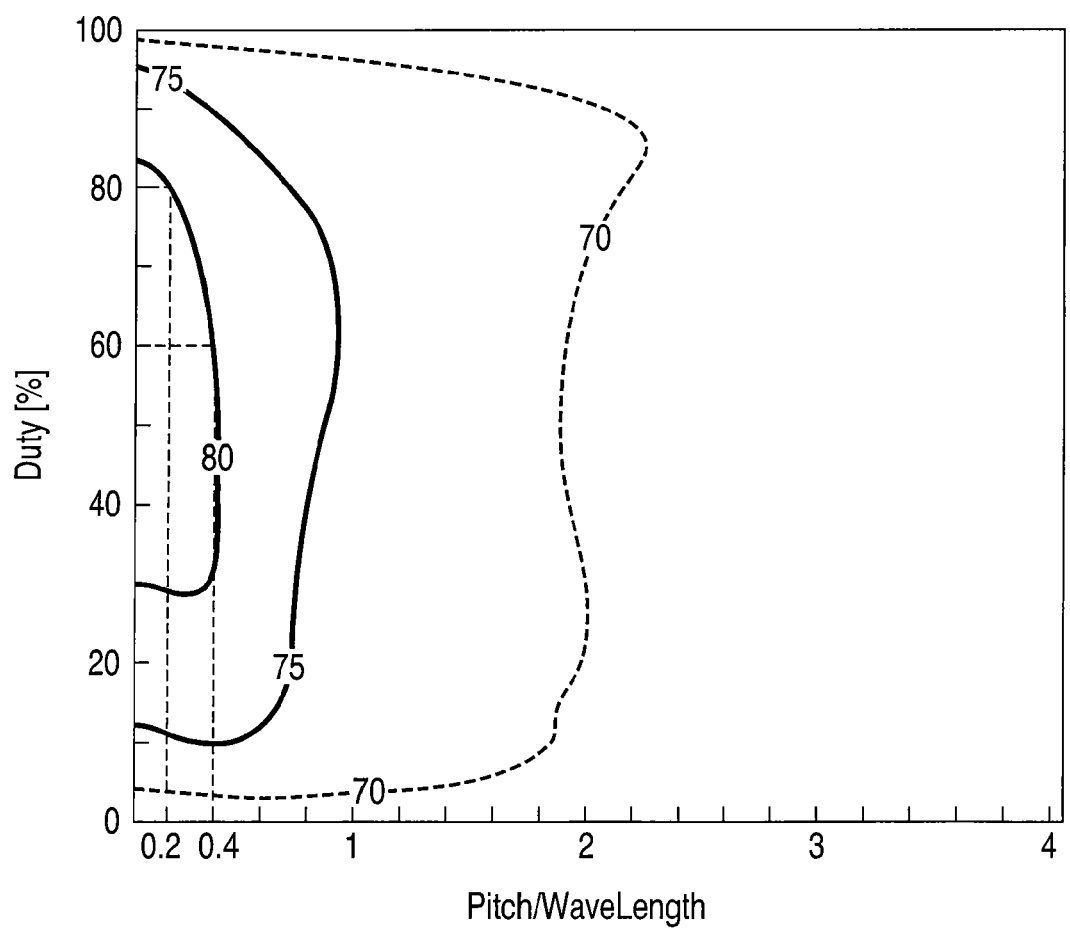
F I G. 5

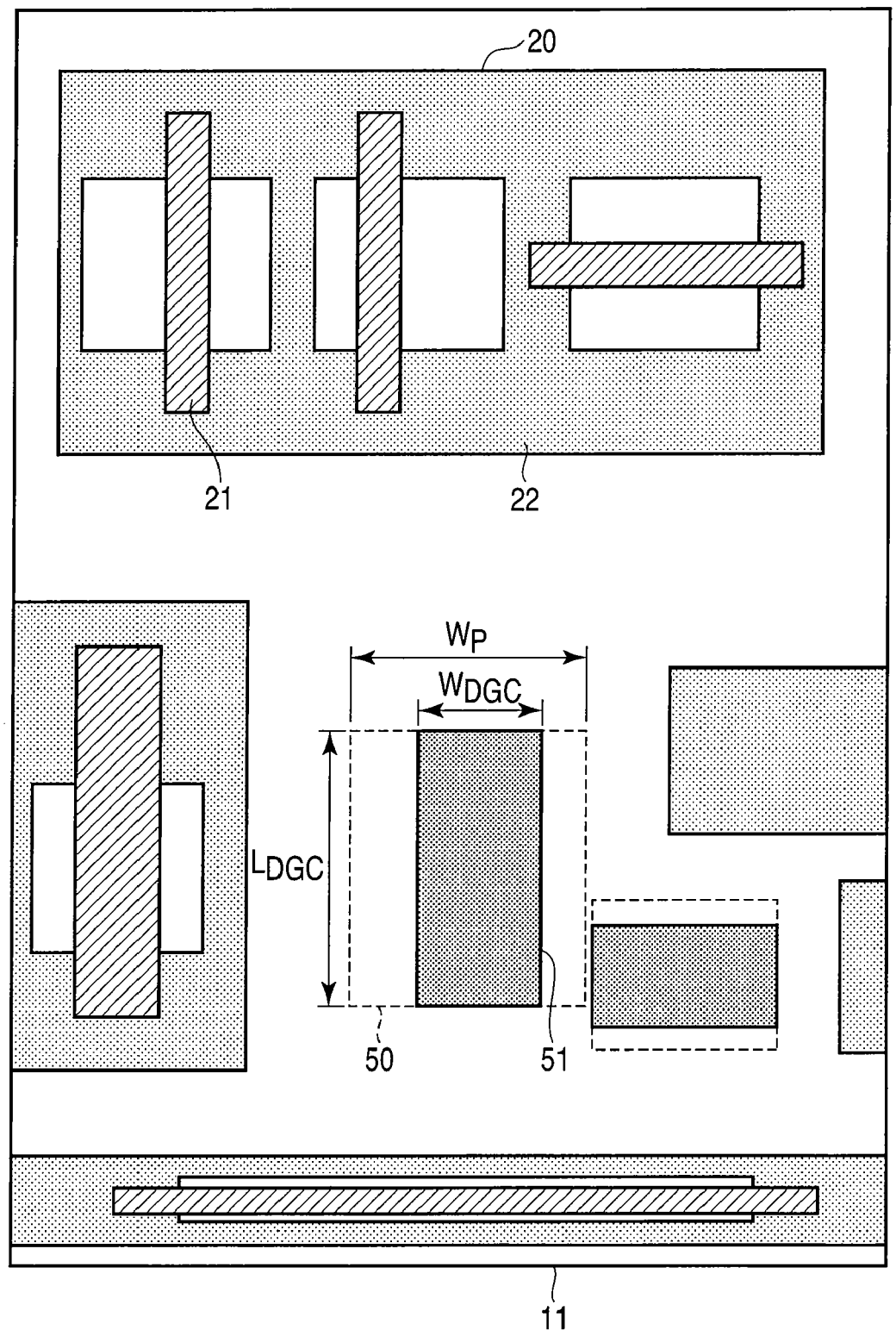
F I G. 9

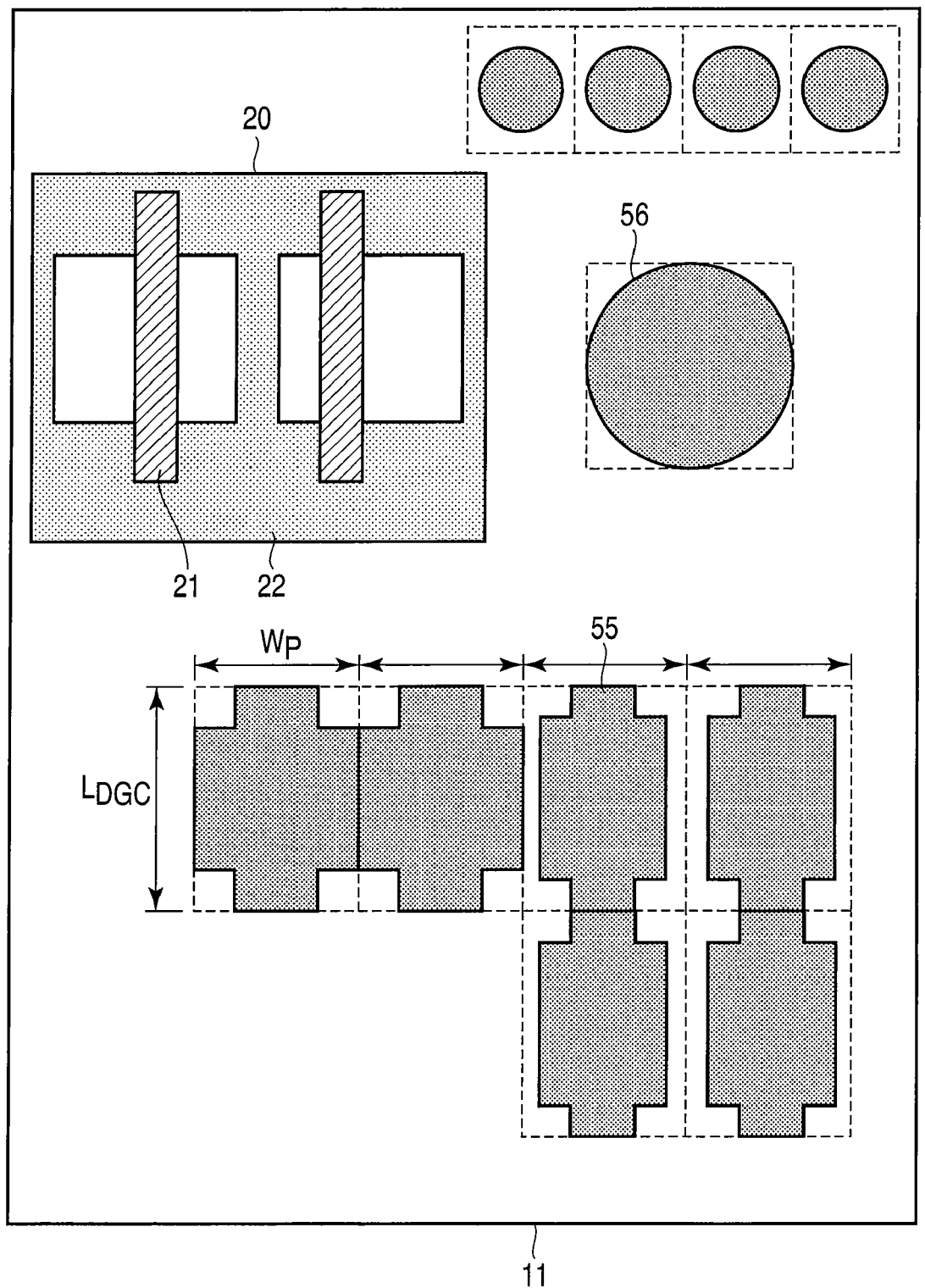
F I G. 10

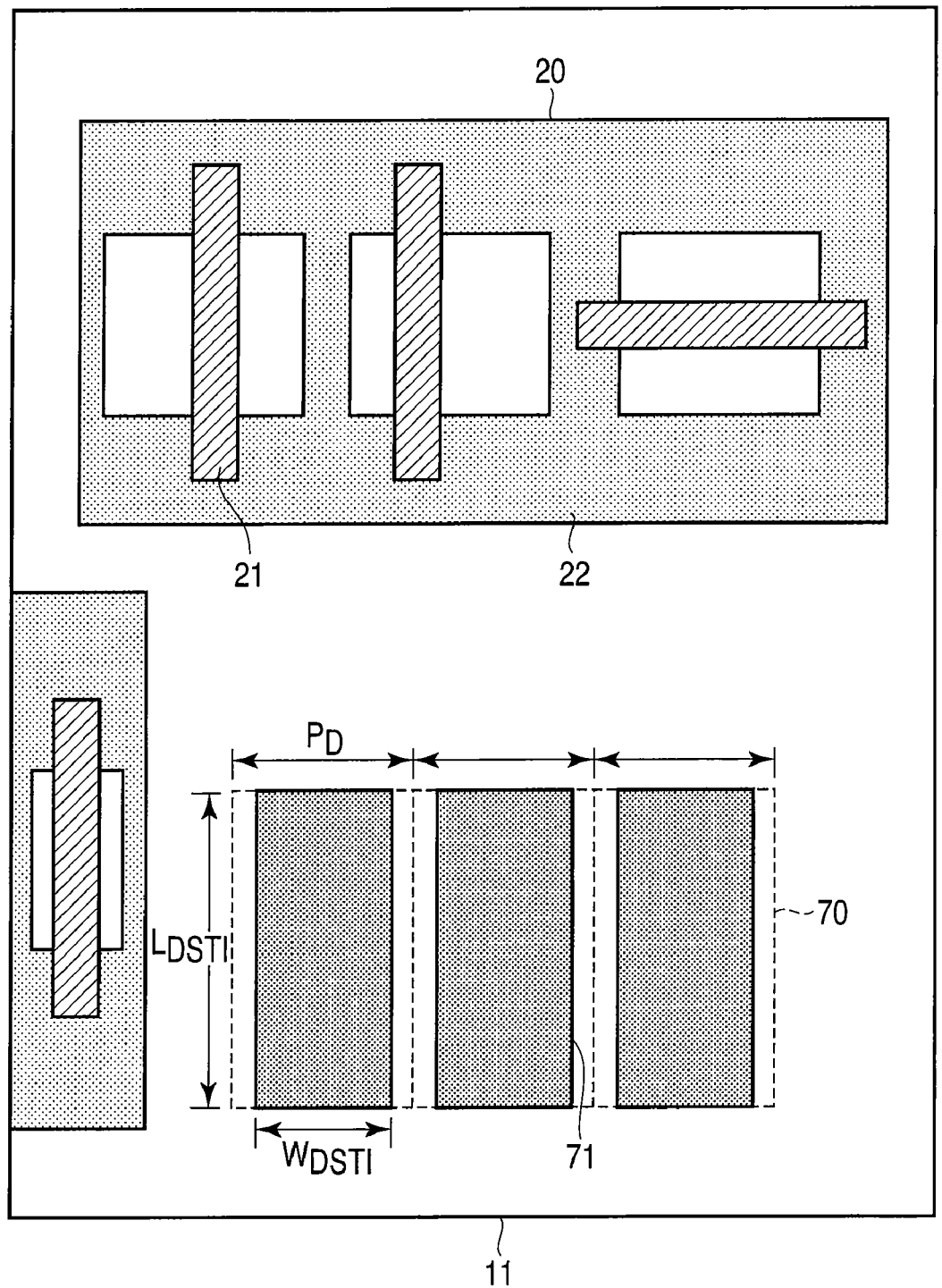
F I G. 11

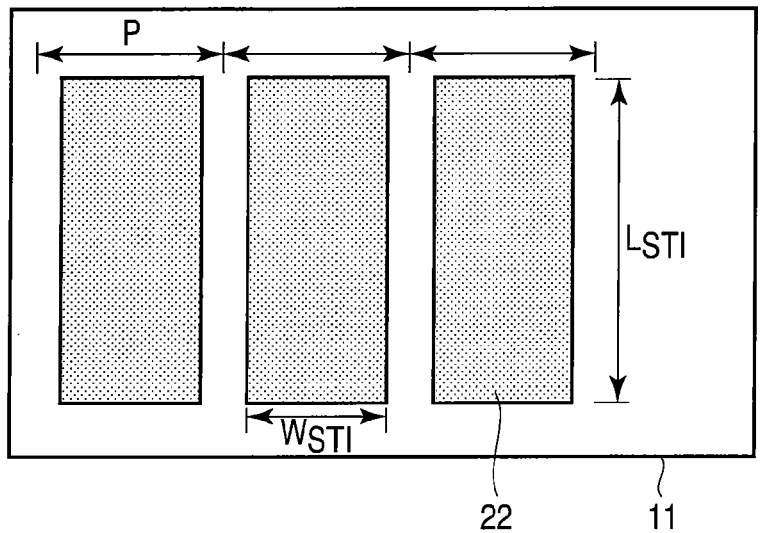
F I G. 12
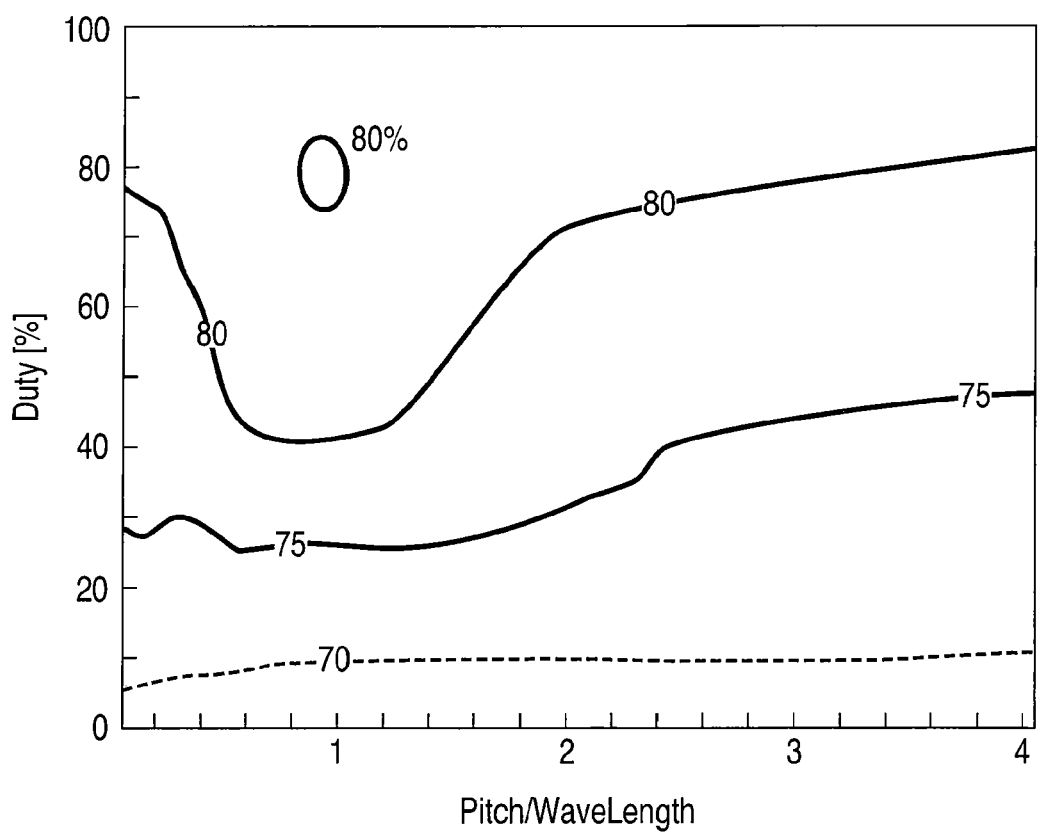
F I G. 13

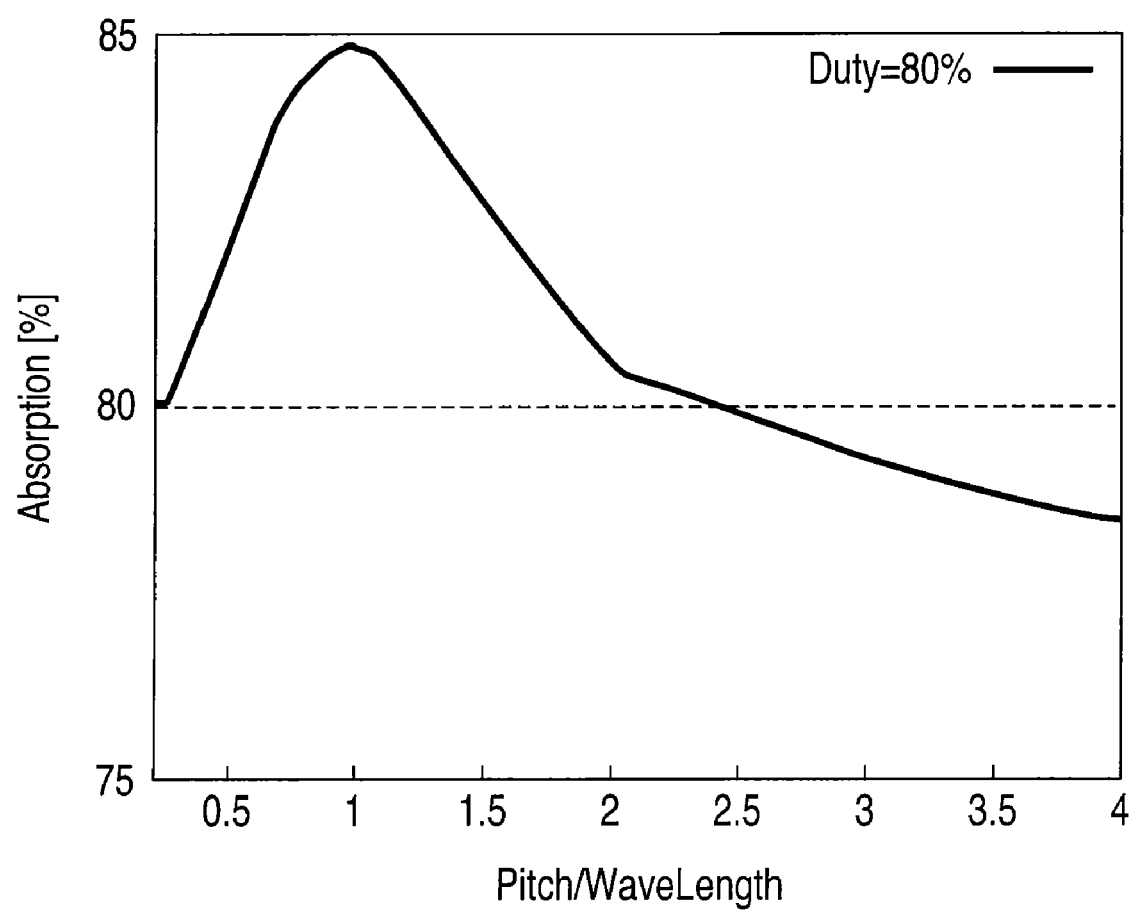
F I G. 14

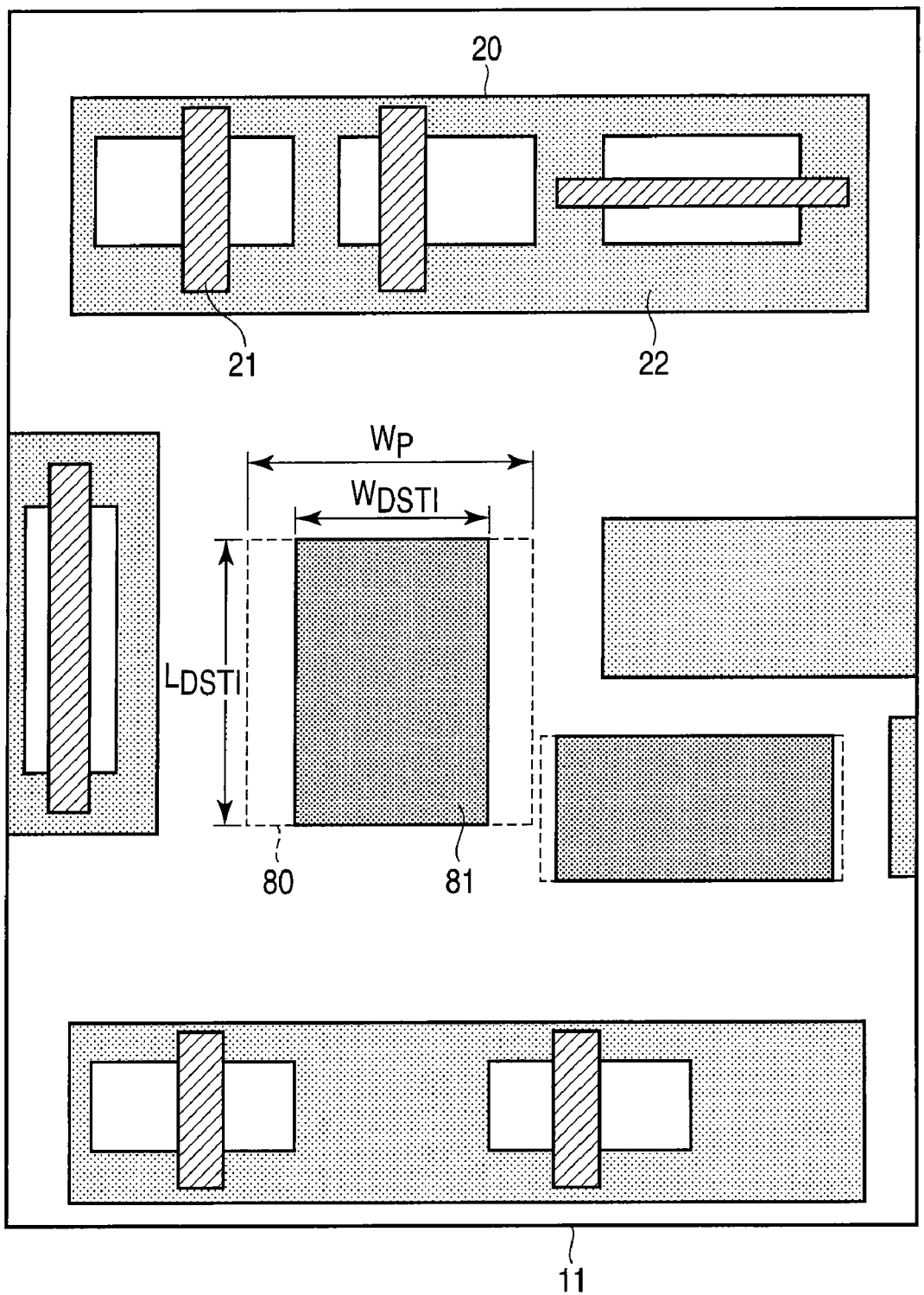
F I G. 15

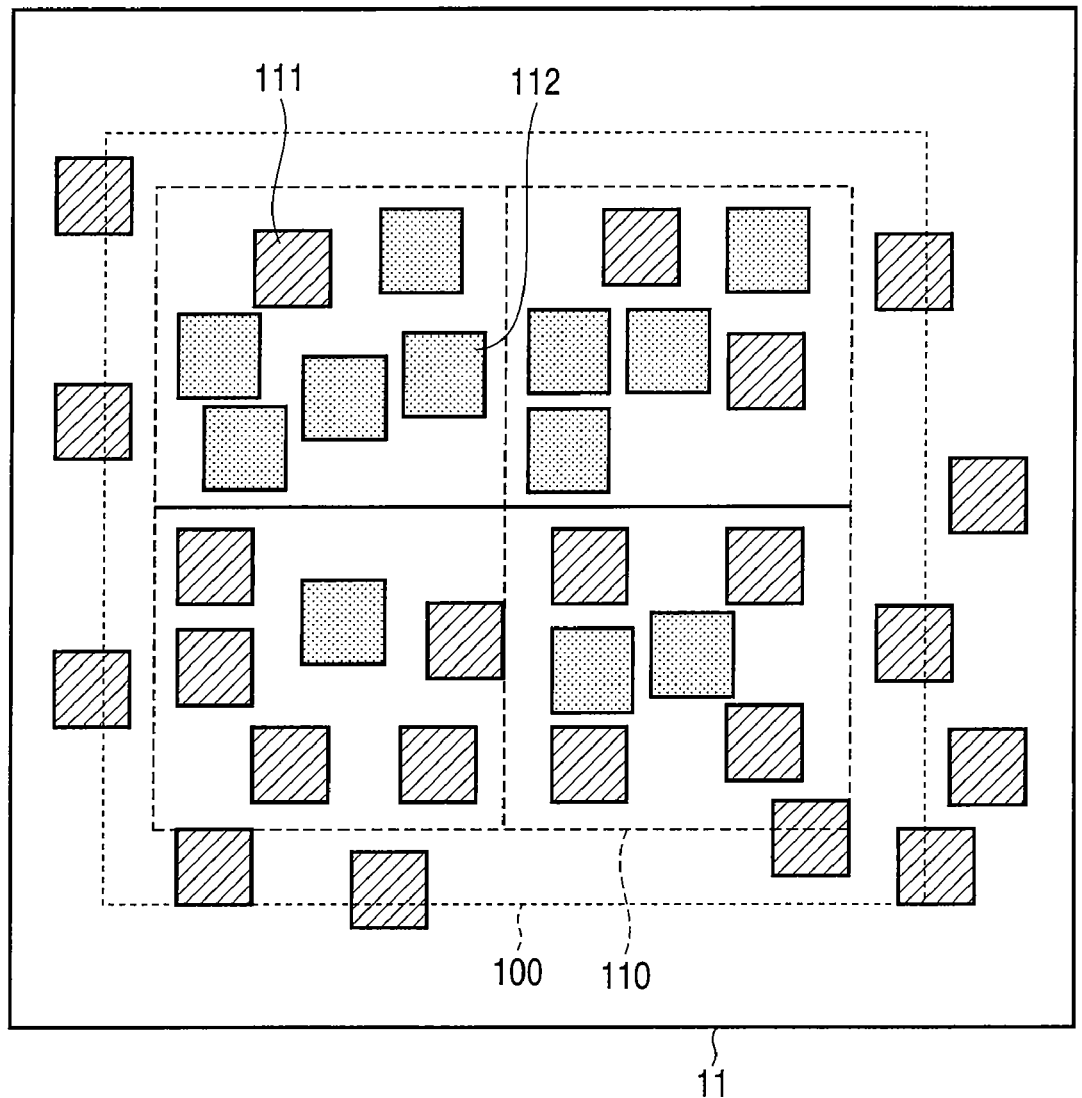
F I G. 16

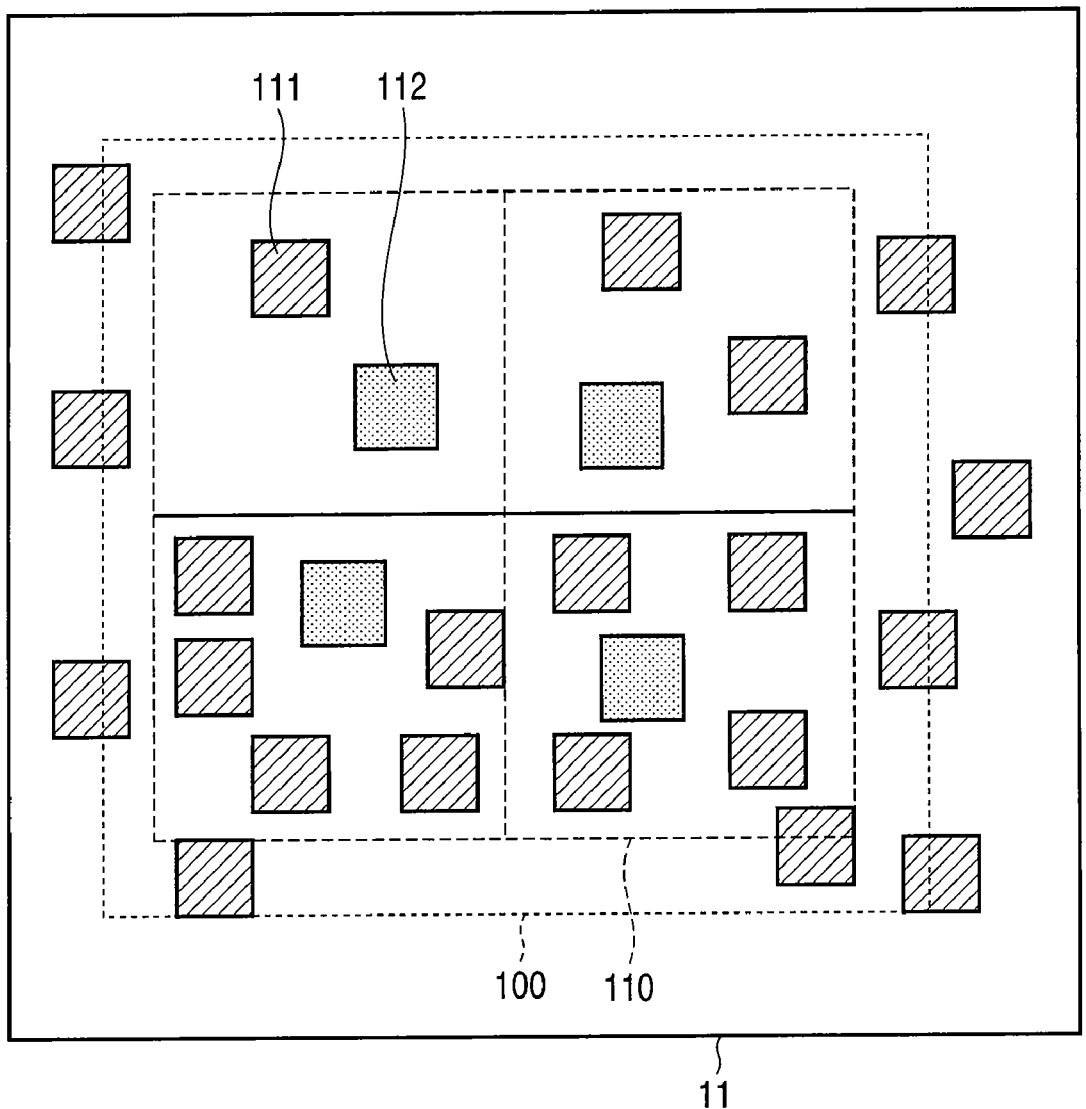
F I G. 17

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2007-315056, filed Dec. 5, 2007, the entire contents of which are incorporated herein by reference.

BACKGROUND OF THE INVENTION

1. Field of the Invention

This invention relates to a semiconductor device in which the surface portion of a semiconductor substrate having a dummy pattern formed separately from an integrated circuit pattern is annealed by radiation of light and a manufacturing method thereof.

2. Description of the Related Art

Conventionally, as a technique for putting an integrated circuit arranged on a semiconductor substrate into an electrically activated state, it is normal to establish and maintain the semiconductor substrate at a high temperature for several minutes by means of an annealing device having a heater. However, with recent miniaturization of integrated circuits, it becomes necessary to anneal only the surface portion of the semiconductor substrate and it becomes increasingly necessary to markedly reduce the annealing time in comparison with the conventional case.

Therefore, recently, the optical annealing technique for radiation light with high intensity for a short period to electrically activate an integrated circuit is proposed (T. Ito, et al., "10-15 nm Ultras shallow Junction Formation by Flash-Lamp Annealing", Jpn. J. Appl. Phys., 2002, Vol. 41, 2394-2398). With this technique, the configuration is made to apply light from a light source to the surface of a semiconductor substrate arranged on a susceptor. The light radiation time is several tens of seconds or less and, as a result, the surface temperature of the semiconductor substrate instantly reaches a high temperature and only the surface portion is annealed.

As the light source, a light source of spike rapid thermal annealing (spike-RTA) that applies blackbody radiation light of approximately 3000K to 3500K for several seconds, flash lamp annealing (FLA) that applies light with a temperature of approximately 6500K for approximately 1 ms or laser spike annealing (LSA) that applies monochromatic light of wavelength approximately 10 μm for approximately 1 ms can be used.

In the optical annealing process, it is known that temperature irregularities occur on the semiconductor substrate. If the temperature irregularity is large, a variation in the threshold voltage of a circuit or crystal defects due to thermal stress will occur. Therefore, a method for forming an insulating film on the semiconductor substrate on which an integrated circuit pattern is formed and then forming a light absorption film that uniformly absorbs light on the insulating film to make the surface temperature uniform is proposed (Jp-A 2000-138177 (KOKAI)).

However, with the above type of method, it is not the semiconductor substrate itself (the semiconductor substrate including the integrated circuit pattern such as a gate pattern, element isolation pattern and the like) but the light absorption film formed on the insulating film. Therefore, time delay occurs from the time when the light absorption film is heated until the time the heat of the light absorption film is transmitted to the semiconductor substrate through the insulating film. The time delay becomes a factor that obstructs the short-time annealing process and, as a result, the circuit performance will be degraded.

BRIEF SUMMARY OF THE INVENTION

According to one aspect of the present invention, there is provided a semiconductor device subjected to an optical annealing process by radiation light whose principal wavelength is 1.5 μm or less and including a circuit pattern region formed on a semiconductor substrate, the circuit pattern region including an integrated circuit pattern related to a circuit operation and having a gate pattern, and a dummy pattern region formed separately from the circuit pattern region on the semiconductor substrate, the dummy pattern region including dummy gate patterns that have the same structure as that of the gate pattern of the integrated circuit pattern and the dummy gate patterns being repeatedly arranged with a pitch 0.4 times or less the principal wavelength.

According to another aspect of the present invention, there is provided a semiconductor device subjected to an optical annealing process by radiation light whose principal wavelength is 1.5 μm or less and including a circuit pattern region formed on a semiconductor substrate, the circuit pattern region including an integrated circuit pattern related to a circuit operation having an element isolation pattern, and a dummy pattern region formed separately from the circuit pattern region on the semiconductor substrate, the dummy pattern region including dummy element isolation patterns that have the same structure as that of the element isolation pattern and the dummy element isolation patterns being repeatedly arranged with a pitch twice or less the principal wavelength.

According to still another aspect of the present invention, there is provided a semiconductor device subjected to an optical annealing process by radiation light whose principal wavelength is 1.5 μm or less and including a circuit pattern region formed on a semiconductor substrate and including an integrated circuit pattern related to a circuit operation, and a dummy pattern region formed separately from the circuit pattern region on the semiconductor substrate and including dummy patterns that are not related to the circuit operation, wherein a minimum value of sandwiching width with respect to the dummy patterns in the dummy pattern region is twice or less the principal wavelength.

BRIEF DESCRIPTION OF THE SEVERAL VIEWS OF THE DRAWING

FIG. 3 is a view showing the pattern arrangement of a semiconductor device according to a first embodiment of this invention.

FIG. 4 is a view showing an example of repeatedly arranged gates as a circuit pattern.

FIG. 5 is a characteristic diagram showing the pattern-dependency of a light absorption rate in the gate arrangement of FIG. 4.

FIG. 9 is a view showing an example in which an isolated GC is used as a dummy pattern.

FIG. 10 is a view showing an example in which cross-shaped dummy patterns and circular dummy patterns are used.

FIG. 11 is a view showing the pattern arrangement of a semiconductor device according to a second embodiment of this invention.

FIG. 12 is a view showing an example of repeatedly arranged STI regions as a circuit pattern.

FIG. 13 is a characteristic diagram showing the pattern-dependency of a light absorption rate in the STI arrangement of FIG. 12.

FIG. 14 is a characteristic diagram showing the relation between the STI pitch and the light absorption rate.

FIG. 15 is a view showing an example in which an isolated STI region is used as a dummy pattern.

FIG. 16 is a view showing the pattern arrangement of a semiconductor device according to a third embodiment of this invention.

FIG. 17 is a view showing a modification of the third embodiment.

DETAILED DESCRIPTION OF THE INVENTION

Before explaining embodiments of this invention, the principle of this invention is explained.

In this invention, when the optical annealing process is performed, a dummy pattern is arranged in a portion of a semiconductor device in which the light absorption rate is low (generally, a region in which no pattern is formed on the surface of the semiconductor substrate). In this case, the dummy pattern has a feature of the order of the principal wavelength of irradiating light used in the optical annealing process. With the above dummy pattern, since the light absorption rate becomes high because of the light interference effect, the light absorption rate is made uniform.

At this time, it is supposed that the principal wavelength of irradiating light is set in a wavelength region in which the semiconductor substrate absorbs light and is set to 1.5 μm or less. However, as the principal wavelength, the peak value of the spectrum of irradiating light is set when the irradiating light is monochromatic light. In a case where the irradiating light is not monochromatic light, the peak value of the spectrum function is set as the principal wavelength when the spectrum of irradiating light in the wavelength region from 200 nm to 2 μm is fitted according to the spectrum function of blackbody radiation light having temperatures of 2500K to 7000K.

The dummy pattern is not related to the operation of an electrical circuit and is not required at the circuit operation time. Further, when wirings are formed in the circuit in the wiring process after the optical annealing process, it is not necessary to form wirings for the dummy pattern. The circuit in which the wirings are not formed can be regarded as a dummy pattern. Various types of circuits related to the electrical circuit operations are called circuit patterns.

Figure 1:
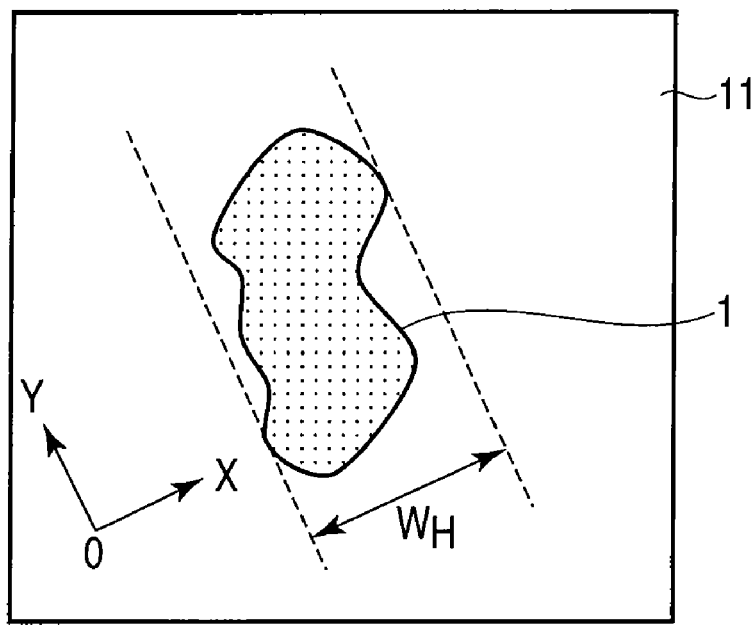
FIG. 1 is a schematic view for explaining the definition of the sandwiching width of a pattern.

It is supposed that the minimum value of the sandwiching width is set to twice the principal wavelength or less as the concrete size of the dummy pattern. In this case, the sandwiching width is defined as follows. As shown in FIG. 1, the surface of the semiconductor substrate on which the pattern of a semiconductor integrated circuit is arranged is called a main surface 11 and it is assumed that a dummy pattern 1 is arranged on the main surface 11. At this time, orthogonal coordinates X, Y are taken on the main surface and two parallel straight lines in one coordinate direction are taken. The dummy pattern 1 is set to lie in a region sandwiched between the two lines. The distance between the two lines is gradually reduced and when the respective lines are brought into contact with the dummy pattern 1, the distance between the two straight lines is called sandwiching width $W_H$.

However, if the dummy patterns are repeatedly arranged with constant pitches P twice or more in one direction, the pitch P is set as the sandwiching width $W_H$ ($P=W_H$). Further, if the dummy patterns are repeatedly arranged twice or more in two directions and with different pitches in the respective directions, the smaller pitch is set as the sandwiching width $W_H$.

We set a dummy area for a dummy pattern as follows.

When dummy patterns are repeatedly arranged in two directions with constant pitches P1, P2 for each direction, the dummy area is set to be P1×P2.

When the dummy patterns are repeatedly arranged in one direction with constant pitch P1, the dummy pattern's sandwiching width is set to be w1 in the orthogonal direction. The dummy area is set to be P1×w1.

When dummy patterns are not periodically arranged in any directions, w1 and w2 are set to be the dummy pattern's sandwiching widths in two orthogonal directions respectively. The dummy area is set to be w1×w2.

The coverage factor of an object is set to be the ratio of the area of object to a dummy area.

Figure 2:
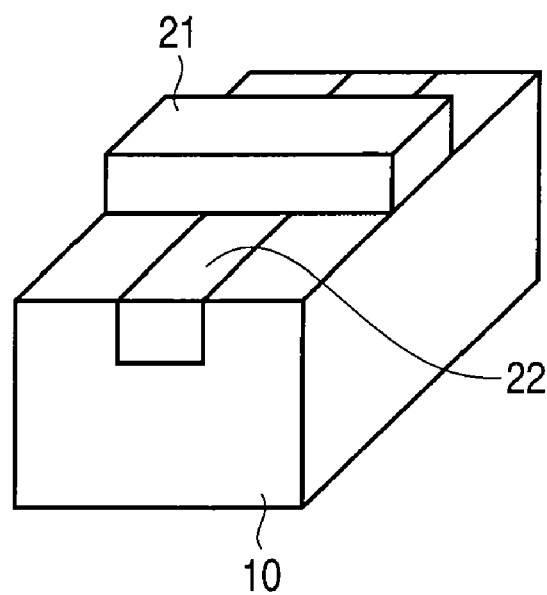
FIG. 2 is a schematic view showing an example of the structure of a basic circuit structure on a semiconductor substrate.

The circuit structure has the basic structure as shown in FIG. 2 and is configured by a gate conductor (GC) 21 and shallow trench isolation (STI) region 22. The dimensions of the GC 21 and STI region 22 are variously set and the circuit pattern shape becomes complicated as a whole, but the basic structure is the same. The refractive indices of the GC 21 and semiconductor substrate 10 are equal to each other and the refractive index of the STI region 22 is equal to that of $SiO_2$. In order to simplify the dummy pattern designing process as far as possible, it is preferable to form the dummy pattern to have the same shape as that of the circuit pattern. Therefore, as the dummy pattern, a pattern configured by a dummy GC or dummy STI region not related to the circuit operation is considered.

In this case, the dummy GC has the same optical characteristic as the GC of the circuit pattern and the restriction on the shape such as the thickness and maximum width is the same as that of the GC. Further, the dummy STI region has the same optical characteristic as the STI region of the circuit pattern and the restriction on the shape is the same as that of the STI region. It is supposed that, in the dummy pattern region, the coverage factor of the dummy GC is set to 30% to 80% inclusive and the coverage factor of the dummy STI region is set no lower than 45% and lower than 100%. In this case, the coverage factor indicates the ratio of the occupied area on the main surface of the semiconductor substrate. For example, the coverage factor of the dummy GC in the dummy pattern region is the ratio of the occupied area of the dummy GC with respect to the dummy pattern region.

The arrangement position of the dummy pattern is set in a coarse region in the surface area of the semiconductor substrate. In this case, the coarse region is defined as a region in which no circuit pattern is present and that has the size to contain a square whose one-side length is equal to the principal wavelength. Further, a region other than the coarse region is called a dense region. In the dense region, a circuit pattern having a feature in a region of the order of the principal wavelength or smaller order is arranged.

As the STI region, an $SiO_2$ region is generally used and the refractive index thereof is different from that of the semiconductor substrate. In a region in which the semiconductor substrate and STI region are provided together, the light absorption rate is higher than that of the semiconductor substrate. Therefore, the light absorption rate can be made uniform by arranging the dummy STI region in a region in which the light absorption rate is low. In this case, the size of the dummy STI region is set less than or equal to the thermal diffusion length. As the thermal diffusion length, the following value is considered. In a graph expressing a variation of the optical annealing radiation intensity with respect to time, the full width at half maximum in the peak value of the radiation intensity is set to $\Delta t$, the thermal diffusion coefficient in the maximum attainable temperature of the semiconductor substrate is set as k and an amount defined as $L=(k\Delta t)^{1/2}$ is set as the thermal diffusion length.

Further, when the dummy pattern is arranged, it is possible to consider that the light absorption rate distribution averaged by means of the thermal diffusion length scale is made uniform by taking it into consideration that the temperature gradient of the scale less than or equal to the thermal diffusion length is made substantially uniform. Therefore, the coarse region is divided into squares or rectangular regions whose one-side length is set less than or equal to the thermal diffusion length in the integrated circuit formation region on the main surface of the semiconductor substrate and each of the regions thus divided is called a divided region. In each divided region, dummy patterns are arranged in the coarse region by means of the following two methods. The first method is to call a set of dummy patterns as a dummy pattern group and set the sum of the coverage factors of the dummy pattern group and the dense region uniform in each divided region. The second method is to make the coverage factor of the dummy pattern group uniform in each divided region.

Thus, the dummy pattern with the high light absorption rate is arranged in the region (coarse region) in which the light absorption rate is low and the light absorption rates are set closer to the upper limit value as a whole and are made uniform to reduce the temperature irregularities. If the characteristic scale of the circuit pattern is no greater than the order of the principal wavelength of light in the semiconductor integrated circuit, the light absorption rate is enhanced because of the light interference effect. On the other hand, in a region in which the characteristic scale of the circuit pattern is larger than the order of the principal wavelength of light or in the coarse region in which the circuit pattern is not present, the light absorption rate is low. Therefore, the dummy pattern having a feature in the region of the order of the principal wavelength of light is arranged in the coarse region to set the light absorption rate closer to the upper limit value and make uniform the light absorption rate. Thus, the temperature irregularity is reduced and the circuit performance can be prevented from becoming degraded.

There will now be described embodiments of the present invention in detail with reference to the accompanying drawings.

First Embodiment

As shown in FIG. 3, a circuit pattern region 20 having integrated circuit patterns related to the circuit operation and a dummy pattern region 30 having dummy patterns that are not related to the circuit operation are arranged on a main surface 11 of a semiconductor substrate of Si or the like. The main surface 11 of the semiconductor substrate is subjected to an optical annealing process by means of a method called spike rapid thermal annealing (spike-RTA) in the semiconductor manufacturing process. The principal wavelength of irradiating light of spike-RTA is 1 μm. If the principal wavelength of irradiating light is greater than or equal to 1.5 μm, the light passes through the semiconductor substrate and heat cannot be generated in the semiconductor substrate. Therefore, it is necessary to set the principal wavelength less than or equal to 1.5 μm.

The circuit pattern region 20 is configured by GCs (gate patterns) 21 and STI region (element isolation pattern) 22.

The dummy pattern region 30 is arranged in a coarse region 42 of the substrate surface 11 and configured by repeatedly arranging dummy GCs (dummy gate patterns) 31 in a lateral direction with constant pitches $P_D$. The shape of the dummy GC 31 is rectangular and the dimension of the pitch $P_D$ is 300 nm. The pattern sandwiching width of the dummy pattern region 30 is equal to the pitch $P_D$, set to 300 nm and set to a value no greater than 0.4 times the principal wavelength 1 μm of irradiating light. Further, the pattern width $W_{DGC}$ of the dummy GC 31 is 150 nm and set to 50% of the pitch $P_D$.

If, in the dummy pattern region 30, a region having one dummy pattern is defined as a unit dummy pattern region 32, the pattern coverage factor of the dummy GC 31 in the unit dummy pattern region 32 is 50% and the pattern coverage factor in the unit dummy pattern region 32 lies in the range of 30% to 80% inclusive. Further, the number of repetitions and the size $L_{DGC}$ of the dummy GC 31 are set to fill a sufficiently large portion of the coarse region 42.

It is supposed that the light absorption rate of the circuit pattern region 20 in the present embodiment is set to 80% to 85%. The light absorption rate is a ratio of energy absorbed into the internal portion without being reflected or scattered to the exterior with respect to light applied to a unit area and is defined in a region smaller than the thermal diffusion length of the semiconductor substrate.

The closest distance between the circuit pattern region 20 and the dummy pattern region 30 is set as the closest distance Dmin and it is supposed that the closest distance Dmin is set to 1 μm or more. The substantial operation of the electrical circuit of the semiconductor integrated circuit is realized by the circuit pattern region 20 and the dummy pattern region 30 does not give an influence to the operation of the circuit.

Next, the operation of this embodiment is explained.

First, the relation between the gate pattern used as the circuit pattern and the light absorption rate is explained. As shown in FIG. 4, a repeatedly arranged circuit pattern having constant pitches P and constant width $W_{GC}$ in one direction is considered. In this case, it is supposed that the size $L_{GC}$ of the GC 21 is sufficiently larger than the principal wavelength. It is proved based on the calculations by the inventors of this application that the light absorption rate obtained at this time has the dependency on the circuit pattern as shown in FIG. 5.

In FIG. 5, the abscissa indicates the pitch P normalized by the principal wavelength and the ordinate indicates the ratio (duty ratio) of the pattern width $W_{GC}$ to the pitch P. It is understood from FIG. 5 that the light absorption rate largely varies depending on the pitch P and the light absorption rate increases as the pitch P becomes smaller. The increasing phenomenon of the light absorption rate expresses the light interference effect. When the pattern coverage factor is 50%, the maximum and minimum values of the light absorption rate are respectively set to approximately 82% and 68% and the variation width of the light absorption rate becomes approximately 14%. When the size $L_{GC}$ is set less than or equal to the principal wavelength order, the light absorption rate is increased by approximately several percent.

The above fact is exactly the same for the dummy pattern region 30 since the optical characteristic is the same. Further, it is understood that the light absorption rate varies in a range of approximately 68% to 85% if the same calculations are made for the circuit pattern configured by the STI region. It can be considered that various circuit patterns are formed by combining the GCs and STI regions of different sizes. Therefore, it is understood that the light absorption rates of the various circuit patterns vary in a range of approximately 68% to 85% and the upper limit of the light absorption rate is set to approximately 85%. Since the pitch $P_D$ of the dummy pattern region 30 shown in FIG. 3 is set to 40% of the principal wavelength and the pattern width $W_{DGC}$ of the dummy GC 31 is set to 50% of the pitch $P_D$, the light absorption rate becomes 80% as shown in FIG. 5.

Based on the above fact, in FIG. 3, if no dummy pattern is arranged in the coarse region 42, the light absorption rate in the coarse region becomes approximately 68%. The circuit pattern region 20 has a feature in a region lower than the principal wavelength and the light absorption rate in the circuit pattern region 20 becomes approximately 80% to 85%. Therefore, the difference between the light absorption rates in the coarse region 42 and the circuit pattern region 20 becomes approximately 12% to 17%. If the dummy pattern region 30 is arranged in the coarse region 42, the difference between the light absorption rates in the dummy pattern region 30 and the circuit pattern region 20 is set within 5% and thus the light absorption rate is made uniform as a whole.

If large temperature irregularity occurs in the semiconductor integrated circuit, the circuit performance is degraded depending on a variation in the threshold voltage of the circuit and crystal defects caused by thermal stress. Particularly, the circuit cannot be correctly operated if the variation in the threshold voltage of the circuit becomes large. In order to ensure the correct operation, it is necessary to suppress the temperature irregularity to 4 to 6° C. or less. With miniaturization of the recent circuit, it becomes necessary to suppress the variation in the threshold voltage as far as possible and it is indispensable to suppress the temperature irregularity to 4° C. or less. In order to attain this, it is necessary to set the variation range of the light absorption rate within a certain range and the permissible range of the light absorption rate is considered below.

Figure 6:
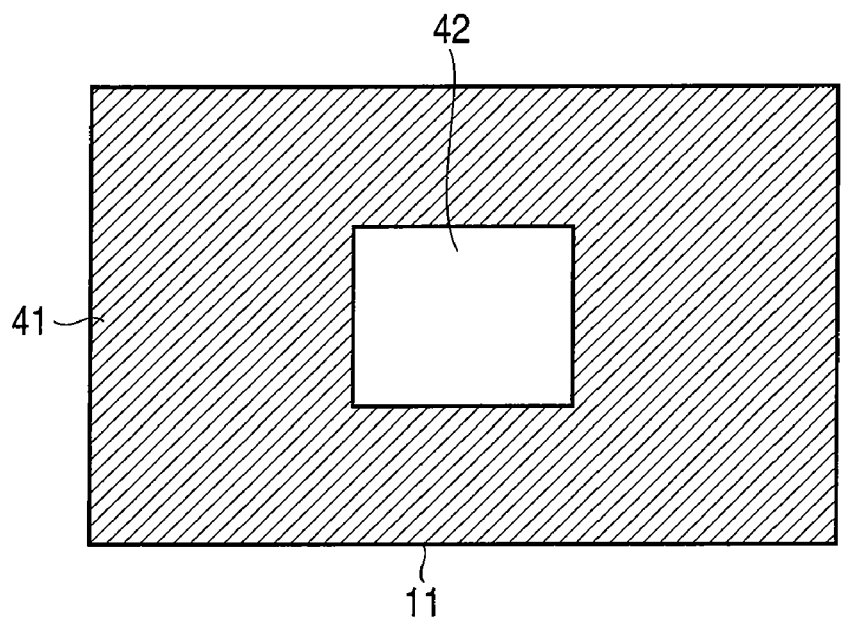
FIG. 6 is a view showing an example in which a dense region and coarse region of a pattern are provided together.

Since the coarse region is a redundant region not related to the circuit operation in the semiconductor integrated circuit, it is more efficient as the coarse region becomes smaller. Generally, it is considered that the scale of the coarse region is 10 mm at maximum. Therefore, as shown in FIG. 6, a case wherein a set of circuit patterns having a feature in a region lower than the principal wavelength order is used as a dense region 41 and the dense region 41 and coarse region 42 are provided together is considered. In this case, it is supposed that the coarse region 42 is a square region and the length of one side is set to 10 mm. The length is considered to be the maximum value of the scale of the coarse region 42.

Figure 7:
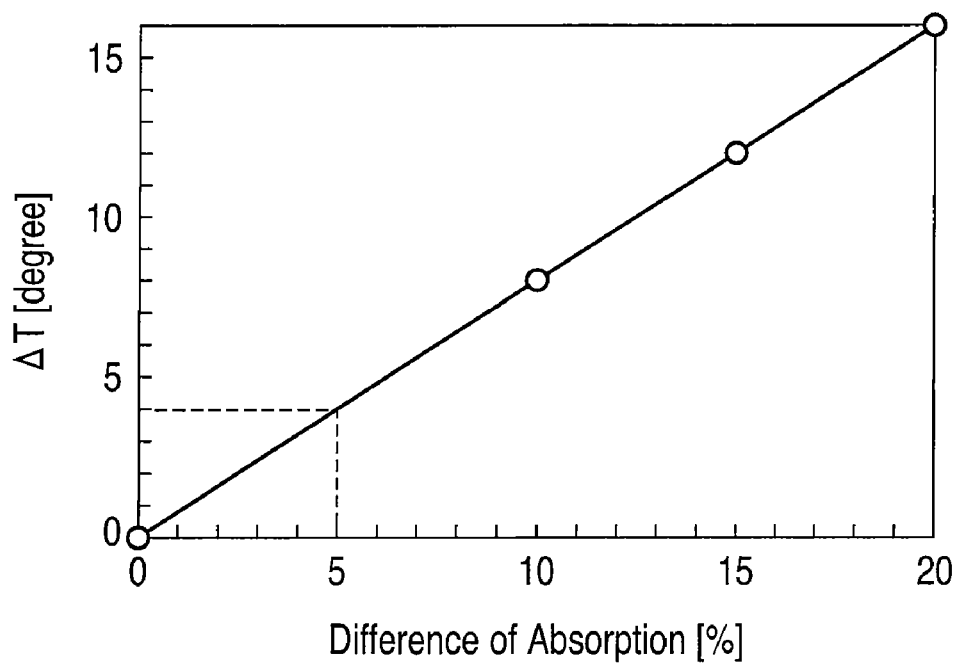
FIG. 7 is a characteristic diagram showing the relation between the difference in temperature and the difference in the light absorption rate.

The light absorption rate of the coarse region 42 is varied from 65% to 85% while the light absorption rate of the dense region 41 is set to 85%. At this time, the thermal diffusion equation is used as a basic equation and the relation between the temperature difference and the difference in the light absorption rate between the dense region 41 and the coarse region 42 is expressed as shown in FIG. 7 based on the result of the calculation for the temperature distribution at the maximum attainable temperature of approximately 1100° C. At this time, the abscissa indicates the difference in the light absorption rate and the ordinate indicates the temperature difference.

It is understood from FIG. 7 that the difference in the light absorption rate must be set within 5% in order to set the temperature difference within 4° C. Thus, as the dummy pattern, a pattern whose light absorption rate is set within 5% from the upper limit, that is, in a range from 80% to 85% may be arranged. The dummy pattern region 30 shown in FIG. 3 has the light absorption rate of approximately 80% and satisfies the above condition.

In FIG. 3, if the dummy pattern region 30 is set excessively closer to the circuit pattern region 20, a leak current occurs, the power consumption increases and heat is generated. Therefore, the closest distance Dmin is set to 1 μm or more to prevent occurrence of the leak current.

Thus, according to the present embodiment, the dummy pattern region 30 having the dummy GCs 31 repeatedly arranged with the pitch less than or equal to 0.4 times the principal wavelength of irradiating light is provided separately from the circuit pattern region 20 having the integrated circuit patterns such as the GCs 21, STI region 22 on the main surface 11 of the semiconductor substrate. Thus, the light absorption rate of the semiconductor substrate is set closer to the upper limit as a whole and made uniform to reduce the temperature irregularity in the substrate surface. As a result, the temperature irregularity can be reduced without causing a delay in the temperature raising time of the semiconductor substrate when the optical annealing process is performed and thus the circuit performance can be enhanced.

Further, since the dummy pattern is formed in a rectangular form in this embodiment, an advantage that the semiconductor integrated circuit can be easily formed in the manufacturing process can be attained. Further, the dummy GC 31 can be formed at the same time as formation of the GC 21 of the circuit pattern region 20 and therefore the number of steps of forming the dummy pattern region 30 is not increased.

This invention is not limited to the above embodiment and can be variously modified without departing from the scope thereof.

Figure 8:
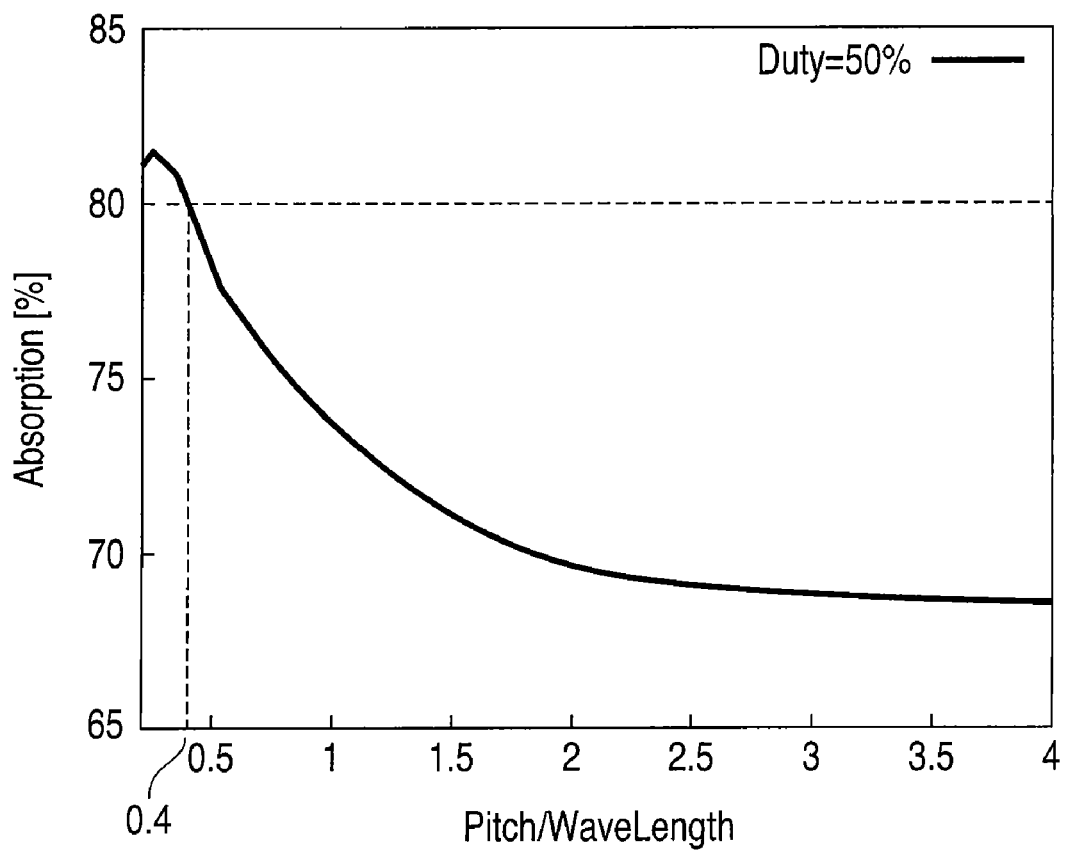
FIG. 8 is a characteristic diagram showing the relation between the pitch of the gate pattern and the light absorption rate.

For example, a large number of dummy patterns whose light absorption rate is set in the range of 80% to 85% are provided other than the above dummy patterns. There is a point at which the light absorption rate becomes the maximum when the duty ratio is set to approximately 50% as shown in FIG. 5. FIG. 8 shows the relation between the light absorption rate and the pitch when the duty ratio is set to 50%. It is understood from FIG. 8 that the light absorption rate becomes 80% or more if the pitch is set to approximately 40% of the principal wavelength or less. Further, it is understood from FIG. 5 that the light absorption rate becomes 80% or more if the duty ratio is set in a range of approximately 30% to 60% with the pitch set in the above range. If the pitch is set equal to or lower than 20% of the principal wavelength, the light absorption rate becomes 80% or more when the duty ratio is set in a range of approximately 30% to 80%.

Therefore, in the dummy GC 31 shown in FIG. 3, the pitch $P_D$ may be set to 40% or less of the principal wavelength and more preferably to 20% or less, and the pattern width $W_{DGC}$ may be set in a range of 30% to 80% and more preferably in a range of 30% to 60% of the pitch $P_D$. In this case, the pattern coverage factor of the dummy GC 31 in the dummy pattern region 30 is set in a range of 30% to 80% that is the same as the duty ratio.

The above fact can be applied not only to the repeatedly arranged pattern but also to an isolated pattern of one repetition. This is because the dummy pattern having a feature in a region of the wavelength order causes a light interference effect thereby to enhance the light absorption rate. Therefore, as shown in FIG. 9, the isolated pattern may be used as a dummy pattern. In this case, a region surrounded by dotted lines is an isolated pattern region 50 and other dummy patterns or circuit patterns cannot be contained in the region 50.

The isolated pattern region 50 is configured by a dummy GC 51 and the shape of the dummy GC 51 on the surface of the semiconductor substrate is rectangular. The width $W_P$ of the isolated pattern region 50 is set equal to or less than 40% of the principal wavelength, the size $L_{DGC}$ may be set to a certain large value without bringing the isolated pattern region into contact with the circuit pattern or other dummy patterns and the size $W_{DGC}$ is set to 30% to 80% with respect to the width $W_P$ of the dummy pattern region. In this case, since the size $W_{DGC}$ is set smaller than 0.4 times the principal wavelength, the minimum length of the short side of the dummy GC 51 becomes smaller than 0.3 times the principal wavelength. Further, an increase in the light absorption rate due to the light interference effect is reduced by approximately several percent in the isolated dummy pattern region 50 in comparison with the repetitively arranged pattern. However, since the shape thereof is simple, the manufacturing process becomes simple and the dummy pattern region can be arranged even if the coarse region is small or formed in a complicated form.

As the dummy pattern described above, the shape thereof on the surface of the semiconductor substrate is configured in a rectangular shape. The shape is made by taking it into consideration that the dummy pattern manufacturing process is easy. However, the dummy pattern is not limited to the above shape. If the coverage factor of the dummy GC in the dummy pattern region is kept unchanged even when the shapes of the dummy patterns are different, the degree of influence by the light interference effect is substantially kept unchanged and the light absorption rate is made substantially equal.

For example, as shown in FIG. 10, cross-shaped dummy patterns 55 and circular dummy pattern 56 may be arranged. In this case, the sandwiching width of each dummy pattern is set smaller than 0.4 times the principal wavelength of irradiating light. The pattern coverage factor in each dummy pattern region is set in a range of 30% to 80%. The distribution of the light absorption rate in each dummy pattern region does not become biased in one direction and the light absorption rate of the dummy pattern becomes sufficiently uniform.

Further, in the optical annealing process having the principal wavelength different from that of the spike-RTA process, it can be considered that the basic property described above is the same and the pattern size can be substantially scaled according to the principal wavelength.

Second Embodiment

In the first embodiment, the dummy pattern region configured by the dummy GCs is described, but in the present embodiment, a dummy pattern region configured by a dummy STI region is considered. As shown in FIG. 11, a semiconductor integrated circuit configured by a circuit pattern region 20 and dummy pattern region 70 is arranged on a semiconductor substrate main surface 11. In FIG. 11, portions that are the same as those of FIG. 3 are denoted by the same symbols and the detailed explanation thereof is omitted.

The circuit pattern region 20 is configured by GCs 21 and STI region 22. In this case, it is supposed that the circuit pattern region 20 has a feature in a region smaller than the principal wavelength and the light absorption rate in the circuit pattern region 20 is set to 80% to 85%. Further, the dummy pattern region 70 in which dummy STI regions (dummy element isolation patterns) 71 are repeatedly arranged is provided in a coarse region.

The number of repetitions and the size $L_{DSTI}$ of the dummy STI region 71 are set to fill a sufficiently large portion of the coarse region. Further, in FIG. 11, the sandwiching width of each dummy STI region 71 corresponds to the pitch $P_D$, the dimension of the pitch $P_D$ is set equal to that of the principal wavelength and is set to 1 μm and the pattern width $W_{DSTI}$ of the dummy STI region 71 is set to 80% of the pitch $P_D$, that is, 0.8 μm. The pattern coverage factor of the dummy STI regions 71 in the dummy pattern region 70 is set to 80%. In this case, the coverage factor of the dummy STI in the dummy pattern region is the ratio of the occupied area of the dummy STI with respect to the dummy pattern region.

Next, the operation of this embodiment is explained.

As shown in FIG. 12, a repetitively arranged circuit pattern having a constant pitch P and constant pattern width $W_{STI}$ in a preset direction is considered. In this case, it is supposed that the size $L_{STI}$ of the STI region 22 is sufficiently larger than the principal wavelength. At this time, the light absorption rate has the dependency on the circuit pattern as shown in FIG. 13.

In FIG. 13, the abscissa indicates the pitch P normalized by the principal wavelength and the ordinate indicates the ratio (duty ratio) of the pattern width $W_{STI}$ to the pitch P. It is understood from FIG. 13 that the light absorption rate greatly varies with respect to the pitch P and the light absorption rate increases as the pitch P becomes smaller. The pitch-dependency of the light absorption rate is caused by the light interference effect.

In FIG. 13, the maximum value of the light absorption rate is approximately 85%. As shown in FIG. 13, the light absorption rate is set to approximately 85% when the pitch P is set equal to the principal wavelength and the duty ratio is set to 80%. As shown in FIG. 11, this is equal to the dimension of the dummy pattern region 70 and the light absorption rate of the dummy pattern region 70 is set to approximately 85% and becomes the upper limit value of the light absorption rate. Therefore, the difference in the light absorption rate between the circuit pattern region 20 and the dummy pattern region 70 becomes within 5% and the temperature irregularity can be suppressed to 4° C. or lower.

This invention is not limited to the above embodiment and can be variously modified without departing from the scope thereof.

For example, a large number of dummy patterns whose light absorption rate is set in the range of 80% to 85% are provided other than the above dummy patterns. In FIG. 13, the duty ratio at a point at which the light absorption rate becomes the maximum is set to approximately 80%. Further, in FIG. 14, the relation between the light absorption rate and the pitch when the duty ratio is set to 80% is shown. It is understood from FIG. 14 that the pitch must be set less than or equal to approximately 200% of the principal wavelength in order to set the light absorption rate to 80% or more. Further, it is understood from FIG. 13 that the light absorption rate becomes 80% or more if the duty ratio is set in a range of approximately 80% to 100% with the pitch set in the above range. If the pitch the pitch $P_D$ is set to 50% to 140% of the principal wavelength, the light absorption rate becomes 80% or more when the duty ratio is set in a range of approximately 45% to 100%.

Therefore, in the dummy pattern shown in FIG. 11, the pitch $P_D$ of the dummy STI regions 71 may be set less than or equal to 200% of the principal wavelength and more preferably in a range of 50% to 140%, and the pattern width $W_{STI}$ may be set in a range of 45% to 100% and more preferably in a range of 80% to 100% of the pitch $P_D$. In this case, the pattern coverage factor of the dummy STI regions 71 in the dummy pattern region 70 is set in a range of 45% to 100%.

An isolated pattern 81 shown in FIG. 15 may be used as the dummy pattern. In this case, a region surrounded by dotted lines is an isolated pattern region 80 and other dummy patterns or circuit patterns cannot be contained in the region 80. The isolated pattern region 80 is configured by a dummy STI region 81 and the shape of the dummy STI region 81 on the surface of the semiconductor substrate is rectangular. The width $W_P$ of the isolated pattern region 80 is 200% or less of the principal wavelength and the size $L_{DSTI}$ may be set to a certain large value without bringing the isolated pattern region into contact with the circuit patterns or other dummy patterns and the size $W_{DSTI}$ of the dummy STI region 81 is set to 45% to 100% with respect to the width $W_P$ of the dummy pattern region. In this case, since the size $W_{DSTI}$ is set less than or equal to twice the principal wavelength, the length of the short side of the dummy STI region 81 becomes less than or equal to twice the principal wavelength.

The shape of the dummy pattern on the surface of the semiconductor substrate is not limited to a rectangular shape and may be a cross shape or circular shape.

Further, in FIG. 15, the sizes $W_{DSTI}$ and $L_{DSTI}$ may be set no greater than the thermal diffusion length and the dummy pattern region 80 may be entirely configured by the dummy STI region 81. In this case, the coverage factor of the dummy STI region 81 is 100%. If the maximum attainable temperature of the semiconductor substrate is approximately 1100° C. and the radiation time is one second, the thermal diffusion length becomes approximately 3 mm. In the dummy pattern, the light absorption rate becomes 80% or more. In practice, in FIG. 13, if the duty ratio is 80% or more irrespective of the pitch, the light absorption rate becomes 80% or more. This is because the refractive index of the STI region is different from that of the semiconductor substrate and an amount of light reflected is reduced. However, when the pitch becomes greater than or equal to twice the principal wavelength, a difference in the light absorption rate occurs in the dummy pattern. Temperature irregularity caused by the difference in the light absorption rate can be made uniform if the length of the dummy pattern region is less than or equal to the thermal diffusion length.

In the optical annealing process having different principal wavelength than that of the spike-RTA process, it can be considered that the basic property described above is the same and the dimensions of the pattern can be substantially scaled according to the principal wavelength except the thermal diffusion length.

Third Embodiment

As shown in FIG. 16, a semiconductor integrated circuit region 100 is formed on a semiconductor substrate main surface 11 as a partial region of the whole portion of a semiconductor integrated circuit. The semiconductor integrated circuit region 100 is divided into square regions 110 having one side whose length is equal to the thermal diffusion length. In each of the square regions 110, a dummy pattern group 112 that is a set of dummy patterns is arranged. It is supposed that each of the dummy patterns of the dummy pattern group 112 is the same as the dummy pattern descried in the first or second embodiment. A fine circuit pattern region 111 is a region in which a fine circuit pattern having a feature in a region smaller than the principal wavelength is arranged. In this case, in each of the square regions 110, the dummy patterns are arranged so that the total value of the coverage factors of the fine circuit pattern region 111 and the region occupied by the dummy pattern group 112 will become constant.

Next, the operation of the present embodiment is explained.

In each of the square regions 110, the initial heat source distribution at the light radiation time for an optical annealing process is made uniform because of thermal diffusion. By taking this into consideration, temperature irregularity will not occur even if a difference in the light absorption rate occurs in the square regions 110. However, temperature irregularity occurs if a difference in the average value of the light absorption rates in the respective different square regions 110 is large. Therefore, occurrence of the temperature irregularity can be suppressed by making uniform the average values of the light absorption rates in the square regions 110. A region in which the light absorption rate is high is a region occupied by the fine circuit pattern region 111 and dummy pattern group 112 and is called a dense region. The light absorption rate is substantially determined by the distribution of the coverage factors of the dense region and coarse region and the light absorption rate becomes higher if the dense region is larger.

The light absorption rate is made uniform by setting the coverage factor of the dense region constant in each of the square regions 110. By arranging the dummy patterns to satisfy the above condition, the light absorption rate can be efficiently made uniform by using a limited number of dummy patterns.

This invention is not limited to the above embodiment and can be variously modified without departing from the scope thereof.

For example, as shown in FIG. 17, dummy patterns are arranged in the square regions 110 to set constant the coverage factors of the dummy patterns in each of the square regions 110. By this arrangement, in each of the square regions 110, the coverage factor of the dense region becomes high to set the light absorption rate closer to the upper limit value and thus the light absorption rate is made uniform. In this case, since it is not necessary to calculate the coverage factor of the dense region, the manufacturing process becomes simple.

Further, the length of each side of the square region may be set to a desired value less that or equal to the thermal diffusion length. The square region may be a rectangular region and it is sufficient if the respective sides thereof may be set less than or equal to the thermal diffusion length. The dummy patterns are not limited to the gate patterns or element isolation patterns and various types of patterns formed in the circuit pattern region can be applied.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device subjected to an optical annealing process by radiation light whose principal wavelength is 1.5 μm or less, comprising:

a circuit pattern region formed on a semiconductor substrate, the circuit pattern region including an integrated circuit pattern related to a circuit operation and having a gate pattern, an element isolating pattern formed on the semiconductor substrate, and a dummy pattern region formed regionally spaced apart from the circuit pattern region on the semiconductor substrate, the dummy pattern region including dummy gate patterns that have the same thickness and the same optical characteristics with respect to the radiation light as those of the gate pattern of the integrated circuit pattern and the dummy gate patterns being repeatedly arranged with a pitch 0.4 times or less the principal wavelength, wherein the dummy pattern region does not cross the circuit pattern region.

2. The device according to claim 1, wherein a pattern coverage factor of each dummy gate pattern in the dummy pattern region is 30% to 60%.

3. The device according to claim 1, wherein the pitch of the dummy gate patterns is 0.2 times or less the principal wavelength and a pattern coverage factor of each dummy gate pattern is 30% to 80%.

4. The device according to claim 1, wherein each dummy gate pattern is formed in one of a rectangular shape and a cross shape.

5. The device according to claim 1, wherein a closest distance between the circuit pattern region and the dummy pattern region is 1 µm or more.

6. The device according to claim 1, wherein an entire region of the substrate on which the circuit pattern region and the dummy pattern region are to be formed is divided into square or rectangular divided region, a length of each side of each of the divided regions being not more than a thermal diffusion length, so that a total value of pattern coverage factors of the circuit pattern region and the dummy pattern region in each of the divided regions is set substantially constant.

7. The device according to claim 1, wherein an entire region of the substrate on which the circuit pattern region and the dummy pattern region are to be formed is divided into square or rectangular divided regions, a length of each side of each of the divided regions being not more than a thermal diffusion length, so that a pattern coverage factor of the dummy pattern region in each of the divided regions is set substantially constant.

8. A semiconductor device subjected to an optical annealing process by radiation light whose principal wavelength is 1.5 µm or less, comprising:
 a circuit pattern region formed on a semiconductor substrate, the circuit pattern region including an integrated circuit pattern related to a circuit operation and having a gate pattern and an element isolation pattern, and
 a dummy pattern region formed regionally spaced apart from the circuit pattern region on the semiconductor substrate, the dummy pattern region not crossing the circuit patter region and including dummy element isolation patterns that have the same thickness and the same optical characteristics with respect to the radiation light as those of the element isolation pattern and the dummy element isolation patterns being repeatedly arranged with a pitch twice or less the principal wavelength.

9. The device according to claim 8, wherein a pattern coverage factor of each dummy element isolation pattern in the dummy pattern region is 80% to 100%.

10. The device according to claim 8, wherein the pitch of the dummy element isolation patterns is set to 0.5 to 1.4 times the principal wavelength and a pattern coverage factor of the dummy element isolation pattern is 45% to 100%.

11. The device according to claim 8, wherein the dummy element isolation pattern is formed in one of a rectangular shape and a cross shape.

12. The device according to claim 8, wherein a closest distance between the circuit pattern region and the dummy pattern region is 1 µm or more.

13. The device according to claim 8, wherein an entire region of the substrate on which the circuit pattern region and the dummy pattern region are to be formed is divided into square or rectangular divided regions, a length of each side of each of the divided regions is not more than a thermal diffusion length, so that a total value of pattern coverage factors of the circuit pattern region and the dummy pattern region in each of the divided regions is set substantially constant.

14. The device according to claim 8, wherein an entire region of the substrate on which the circuit pattern region and the dummy pattern region are to be formed is divided into square or rectangular divided regions, a length of each side of each of the divided regions is not more than a thermal diffusion length, so that a pattern coverage factor of the dummy pattern region in each of the divided regions is set substantially constant.

15. A semiconductor device subjected to an optical annealing process by radiation light whose principal wavelength is 1.5 µm or less, comprising:
 a circuit pattern region formed on a semiconductor substrate and including an integrated circuit pattern related to a circuit operation, and
 a dummy pattern region formed regionally spaced apart from the circuit pattern region on the semiconductor substrate including dummy patterns, wherein the dummy pattern region does not cross the circuit pattern region,
 wherein a minimum value of sandwiching width with respect to the dummy patterns in the dummy pattern region is twice or less the principal wavelength.

16. The semiconductor device according to claim 15, wherein the dummy pattern is formed of a rectangular dummy gate pattern including the same structure as that of a gate pattern used in the integrated circuit pattern, the sandwiching width with respect to the dummy gate pattern is set equal to the pattern width of a short side of the dummy gate pattern and the pattern width thereof is set to a value 0.3 times or less the principal wavelength.

17. The device according to claim 15, wherein the dummy pattern is formed of a square or rectangular dummy gate patterns including the same structure as that of an element isolation pattern used in the integrated circuit pattern, the sandwiching width with respect to the dummy element isolation pattern is set equal to the pattern width of a short side of the dummy element isolation pattern and the pattern width thereof is set to 0.5 to 1.4 times the principal wavelength.

18. The device according to claim 17, wherein a coverage factor of the dummy element isolation pattern in the dummy pattern region is 100% and length of a long side of the dummy element isolation pattern is set no greater than thermal diffusion length.

19. The device according to claim 15, wherein an entire region of the substrate on which the circuit pattern region and the dummy pattern region are to be formed is divided into square or rectangular divided regions, a length of each side of each of the divided regions being not more than a thermal diffusion length, so that a total value of pattern coverage factors of the circuit pattern region and dummy pattern region in each of the divided regions is set substantially constant.

20. The device according to claim 15, wherein an entire region of the substrate on which the circuit pattern region and the dummy pattern region are to be formed is divided into square or rectangular divided regions, a length of each side of each of the divided regions being not more than a thermal diffusion length, so that a pattern coverage factor of the dummy pattern region in each of the divided regions is set substantially constant.

* * * * *